United States Patent [19]
Mukoyama et al.

[11] Patent Number: 5,825,635
[45] Date of Patent: Oct. 20, 1998

[54] WARP PREVENTION AND CABLE HOLDING STRUCTURE FOR PRINTED CIRCUIT BOARD

[75] Inventors: Takahide Mukoyama; Fujio Ozawa; Takashi Inoue; Katsunori Suzuki; Yasutaka Tsuruoka; Mieko Hirao; Kozo Mori, all of Kawasaki, Japan

[73] Assignee: Fujitsu Limited, Kanagawa, Japan

[21] Appl. No.: 544,160

[22] Filed: Oct. 17, 1995

[30] Foreign Application Priority Data

Mar. 16, 1995 [JP] Japan ..................................... 7-057151

[51] Int. Cl.⁶ ...................................................... H02B 1/20
[52] U.S. Cl. ........................... 361/826; 361/825; 361/827; 174/72 A
[58] Field of Search ..................... 361/825, 826, 361/827; 174/135, 72 A; 248/51, 74.1

[56] References Cited

U.S. PATENT DOCUMENTS

| | | | |
|---|---|---|---|
| 2,896,009 | 7/1959 | Caveney | 174/72 A |
| 3,082,984 | 3/1963 | Larsson et al. | 174/72 A |
| 3,626,086 | 12/1971 | Rubey | 174/72 A |
| 3,842,190 | 10/1974 | Towell | 361/826 |
| 3,944,719 | 3/1976 | Rubey | 361/826 |
| 4,536,826 | 8/1985 | Ahiskali | 361/775 |
| 5,186,377 | 2/1993 | Rawson et al. | 361/752 |
| 5,198,279 | 3/1993 | Beinhaur et al. | 361/748 |

*Primary Examiner*—Leo P. Picard
*Assistant Examiner*—John B. Vigushin
*Attorney, Agent, or Firm*—Helfgott & Karas P.C.

[57] ABSTRACT

A warp prevention structure for a printed circuit board, capable of serving also to perform the slack handling of cables. The warp prevention structure includes a first warp prevention fitting mounted on the printed circuit board in the vicinity of an upper edge thereof so as to extend along the upper edge, and a second warp prevention fitting mounted on the printed circuit board in the vicinity of a lower edge thereof so as to extend along the lower edge. Each of the first and second warp prevention fittings is integrally formed with a plurality of cable holders arranged at equal intervals.

5 Claims, 9 Drawing Sheets

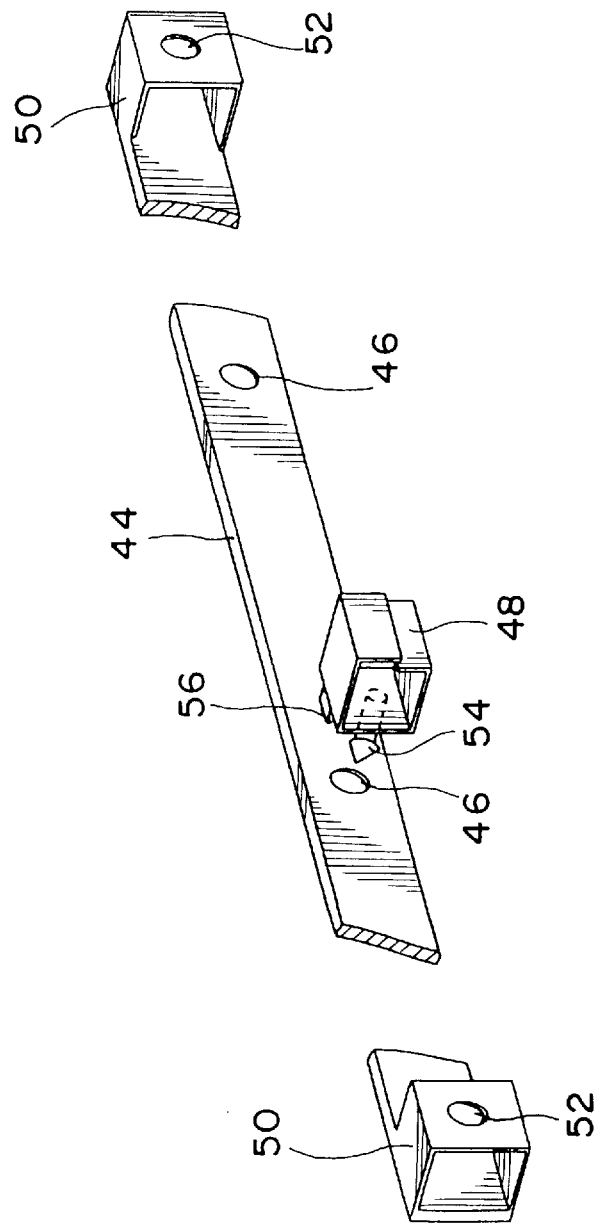

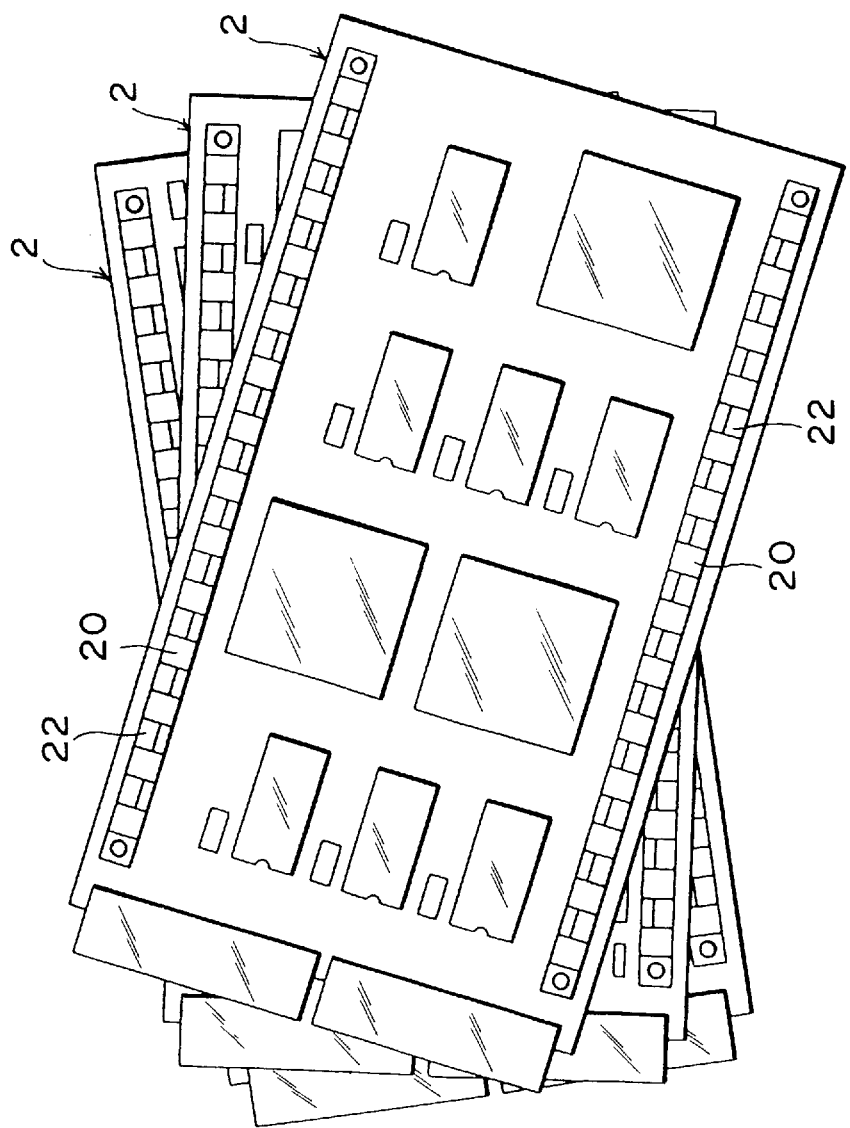

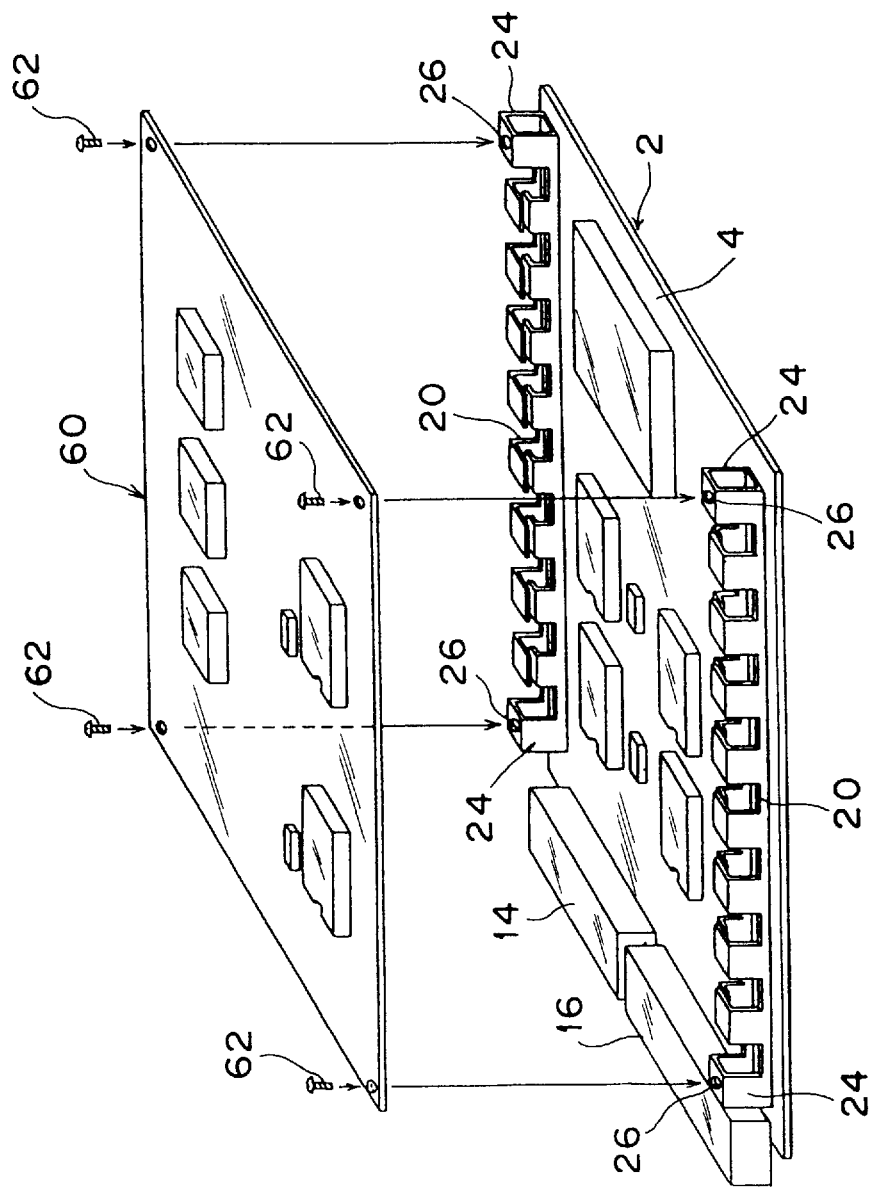

WARP PREVENTION AND CABLE HOLDING STRUCTURE FOR PRINTED CIRCUIT BOARD

BACKGROUND OF THE INVENTION

1. Field of the Invention

The present invention relates to a warp prevention structure for a printed circuit board having a slack handling function for optical cables or coaxial cables.

2. Description of the Related Art

In response to a high level of function of a recent transmission device, upsizing of a printed circuit board to be mounted in the transmission device has been demanded. In accordance therewith, the production of a transmission device using a large printed circuit board has been advanced. However, the larger the printed circuit board, the more likely the warpage of the printed circuit board occurs in dip soldering. Accordingly, it is necessary to take measures for preventing the warpage of the large printed circuit board. Further, an optical communication system having a large communication capacity and fit for high-speed communication has become a mainstream of recent communication systems. In accordance therewith, it becomes necessary to store slack portions of optical cables at a suitable position on the printed circuit board according to the form of mounting of the printed circuit board.

Conventionally known is a warp prevention structure having warp prevention fittings mounted on a large printed circuit board along its upper and lower edges to prevent the warpage of the large printed circuit board. Further, the slack handling of optical cables is conventionally performed by holding the slacks of the optical cables through a tie wrap or the like to a metal fixture fixed to a printed circuit board, and further fixing the optical cables to the printed circuit board by means of a tape to prevent extension of the optical cables from the surface of the printed circuit board. On the other hand, the slacks of coaxial cables are fixed to the printed circuit board by means of a strap wire.

Conventionally, the warp prevention of the printed circuit board and the slack handling of the optical cables or the coaxial cables are effected by individual structures. Accordingly, a mounting space for each structure is necessary, causing a reduction in mounting efficiency. Further, in the conventional structure that the optical cables are fixed to the printed circuit board by the tape as mentioned above, no play is provided to the optical cables, causing a problem such that when a tensile load is applied to the optical cables, optical fibers in the optical cables may be broken.

In the conventional structure that the coaxial cables are fixed to the printed circuit board by the strap wire as mentioned above, it is necessary to preliminarily form a fixing through hole in the printed circuit board. Accordingly, another fixing through hole cannot be added later after completing an electronic circuit package.

SUMMARY OF THE INVENTION

It is therefore an object of the present invention to provide a warp prevention structure for a printed circuit board which can serve also to perform the slack handling of cables.

It is another object of the present invention to provide a warp prevention structure for a printed circuit board which can indicate the coordinates of mounting positions of components on the printed circuit board.

It is still another object of the present invention to provide a warp prevention structure for a printed circuit board which can ensure a cable route at the upper or lower edge portion of the printed circuit board.

In accordance with an aspect of the present invention, there is provided a warp prevention structure for a printed circuit board, comprising a first warp prevention fitting mounted on the printed circuit board in the vicinity of an upper edge thereof so as to extend along the upper edge; and a second warp prevention fitting mounted on the printed circuit board in the vicinity of a lower edge thereof so as to extend along the lower edge; each of the first and second warp prevention fittings being integrally formed with a plurality of cable holders arranged at equal intervals.

Preferably, each of the cable holders has a height greater than a height of each of components mounted on the printed circuit board. Further, each of the first and second warp prevention fittings is formed at its both ends with a pair of supports each having a tapped hole, each of the supports having a height greater than the height of each cable holder.

In accordance with another aspect of the present invention, there is provided a warp prevention structure for a printed circuit board, comprising a first warp prevention fitting mounted on the printed circuit board in the vicinity of an upper edge thereof so as to extend along the upper edge, the first warp prevention fitting having a plurality of mounting holes arranged at equal intervals; a second warp prevention fitting mounted on the printed circuit board in the vicinity of a lower edge thereof so as to extend along the lower edge, the second warp prevention fitting having a plurality of mounting holes arranged at equal intervals; and a plurality of cables holders detachably mounted through the mounting holes on at least one of the first and second warp prevention fittings.

As described above, the plural cable holders are formed integrally on each of the first and second warp prevention fittings. Accordingly, the slack handling of cables can be performed by using the cable holders of each warp prevention fitting, thereby improving the components mounting efficiency. Further, the plural cable holders are arranged at equal intervals on each warp prevention fitting. Accordingly, the coordinates of mounting positions of components can be indicated by the edges of the cable holders, thereby eliminating the need for marking of the coordinates as in the prior art.

Furthermore, a cable route can be ensured at the upper or lower edge portion of the printed circuit board by passing cables through the plural cable holders. Accordingly, extension of the cables from the printed circuit board can be prevented to thereby effectively protect the cables.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 7 is a partially cutaway, perspective view of a warp prevention fitting in the second preferred embodiment;

FIG. 8 is a plan view showing a condition where a plurality of electronic circuit packages are stacked; and FIG. 9 is an exploded perspective view of a preferred embodiment wherein two different electronic circuit packages are integrated together.

DETAILED DESCRIPTION OF THE PREFERRED EMBODIMENTS

Figure 1:
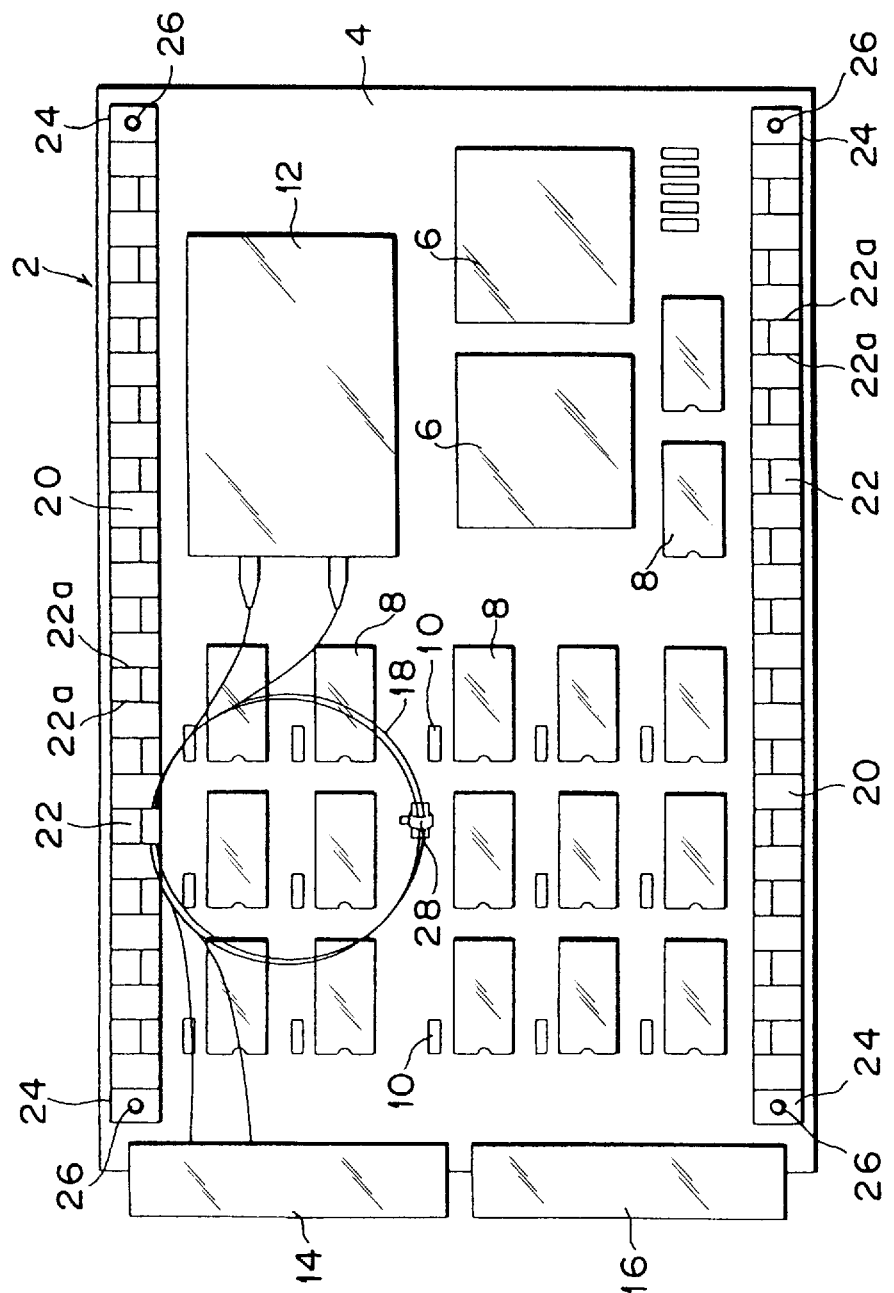
FIG. 1 is a plan view of a first preferred embodiment of the present invention.
Figure 2:
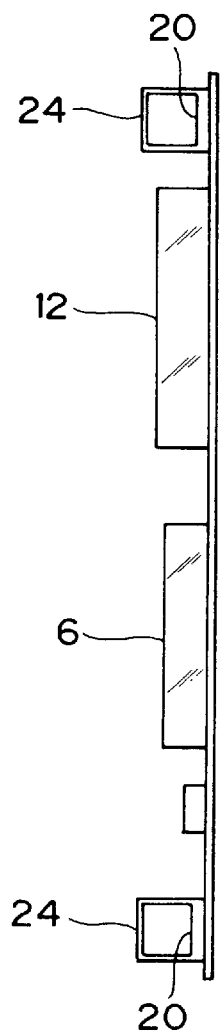
FIG. 2 is a side view of the first preferred embodiment.

Referring to FIG. 1, there is shown a plan view of a first preferred embodiment of the present invention. Reference numeral 2 denotes an electronic circuit package constructed by mounting LSIs 6, ICs 8, discrete components 10 such as resistors and capacitors, and an optical module 12 on a printed circuit board 4. Connectors 14 and 16 are also mounted on the printed circuit board 4 at one end portion thereof. A pair of warp prevention fittings 20 are fixed to the printed circuit board 4 in the vicinity of the upper and lower edges thereof so as to extend along the upper and lower edges. Dip soldering of the components mounted on the printed circuit board 4 is carried out by mounting the warp prevention fittings 20 on the printed circuit board 4 along the upper and lower edges thereof and then dipping the printed circuit board 4 in a soldering bath, thereby effectively preventing a warp of the large printed circuit board 4 tending to occur in dip soldering.

Figure 3:
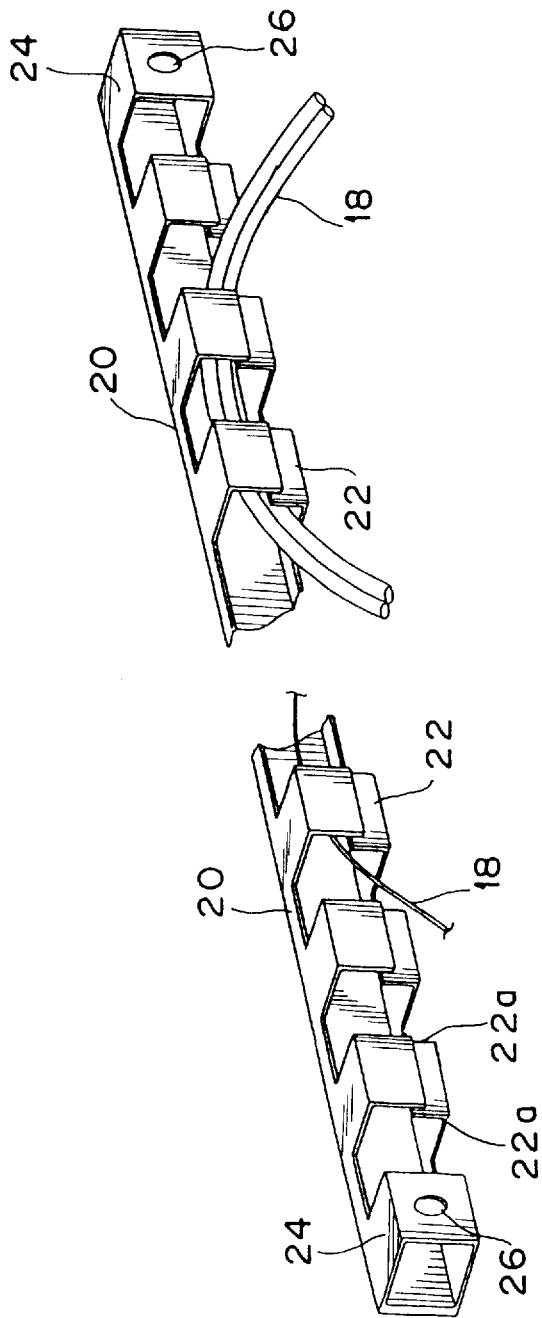
FIG. 3 is a partially cutaway, perspective view of a warp prevention fitting in the first preferred embodiment.

As best shown in FIG. 3, each warp prevention fitting 20 has a plurality of cable holders 22 integrally formed therewith and arranged at equal intervals. The cable holders 22 are formed by stamping a stock sheet metal for each warp prevention fitting 20 at a given pitch of portions for the cable holders 22 and then bending these portions. Each cable holder 22 has a height greater than the heights of the components 6, 8, 10, and 12 mounted on the printed circuit board 4. Each warp prevention fitting 20 is integrally formed at its both ends with a pair of supports (tubular spacers) 24 each having a tapped hole 26. Each support 24 has a height greater than the height of each cable holder 22.

As shown in FIG. 1, slacks 18 of optical cables are held by a suitable one of the cable holders 22, and are fixed through a tie wrap 28 to the printed circuit board 4. In this manner, the warp prevention structure for the printed circuit board according to this preferred embodiment serves also to compactly hold the slacks 18 of the optical cables, thereby preventing that the optical cables may extend off over the upper surface of the printed circuit board 4 and/or from the outer edge of the printed circuit board 4.

The warp prevention fittings 20 each having the plural cable holders 22 are mounted on the printed circuit board 4 along the upper and lower edges thereof. Accordingly, a cable route can be ensured along either edge of the printed circuit board 4, thereby preventing extension of cables from the outer edge of the printed circuit board 4. Further, since the plural cable holders 22 of each warp prevention fitting 20 are arranged at equal intervals, the coordinates of mounting positions of the components to be mounted on the printed circuit board 4 can be indicated by edges 22a of the cable holders 22.

Figure 4:
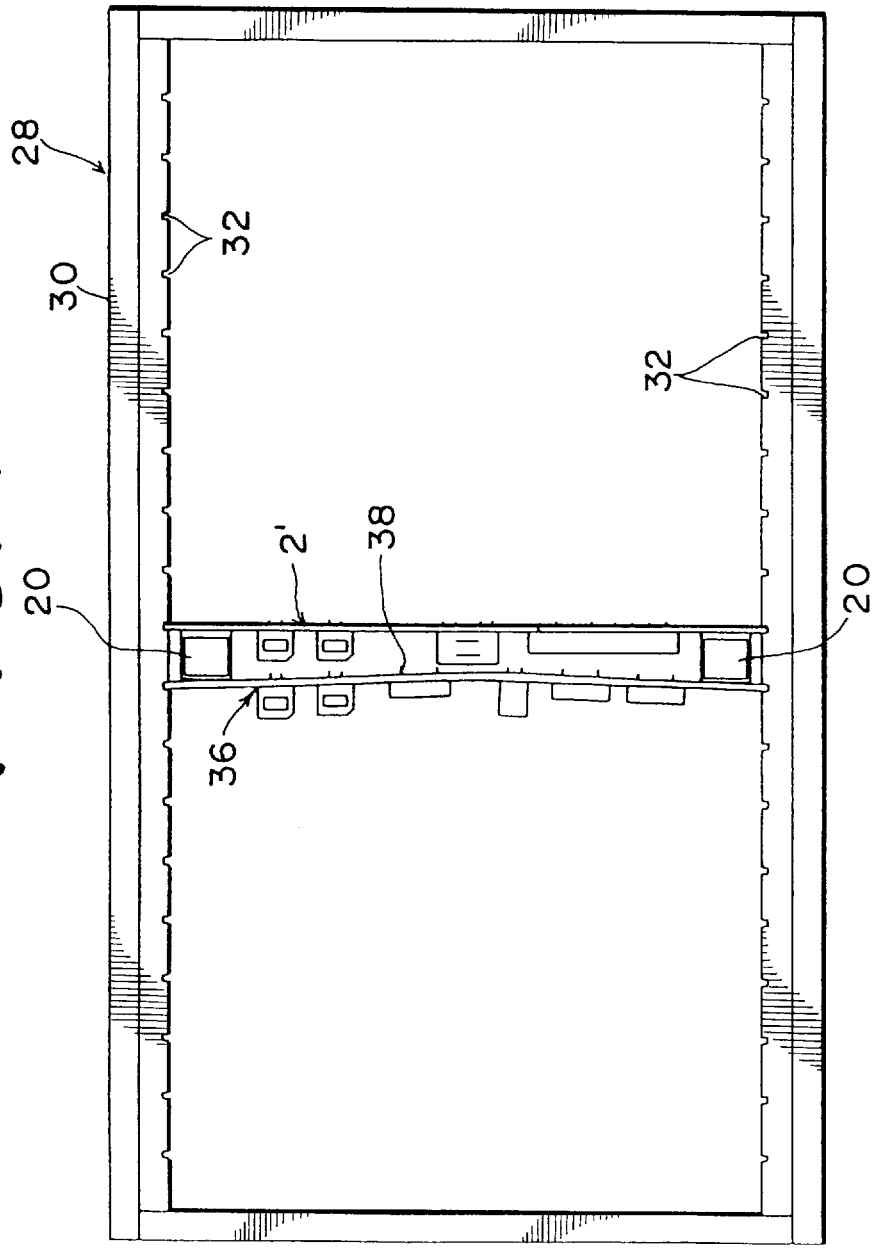
FIG. 4 is an elevational view of a shelf unit.

Referring to FIG. 4, there is shown an elevational view of a shelf unit 28 constructed by vertically mounting a plurality of electronic circuit packages 2' and 36 in a shelf 30. The shelf 30 has a plurality of guide rails 32, and the electronic circuit packages 2' and 36 are inserted along the guide rails 32. The electronic circuit package 2' has a configuration similar to that of the electronic circuit package 2 in the first preferred embodiment in such a manner that a pair of warp prevention fittings 20 each having a plurality of cable holders are fixed to a printed circuit board so as to extend along its upper and lower edges.

Accordingly, even when the electronic circuit package 36 mounted adjacent to the electronic circuit package 2' has a warp as shown in FIG. 4, any component lead 38 of the electronic circuit package 36 can be prevented from coming into contact with any component of the electronic circuit package 2' adjacent to the electronic circuit package 36. Further, since each warp prevention fitting 20 of the electronic circuit package 2' has the plural cable holders spaced from each other, heat is effectively dissipated from the lower to upper sides through the space defined between the adjacent cable holders in the case where the electronic circuit packages 2' and 36 are vertically mounted in the shelf 30 as shown in FIG. 4.

Figure 5:
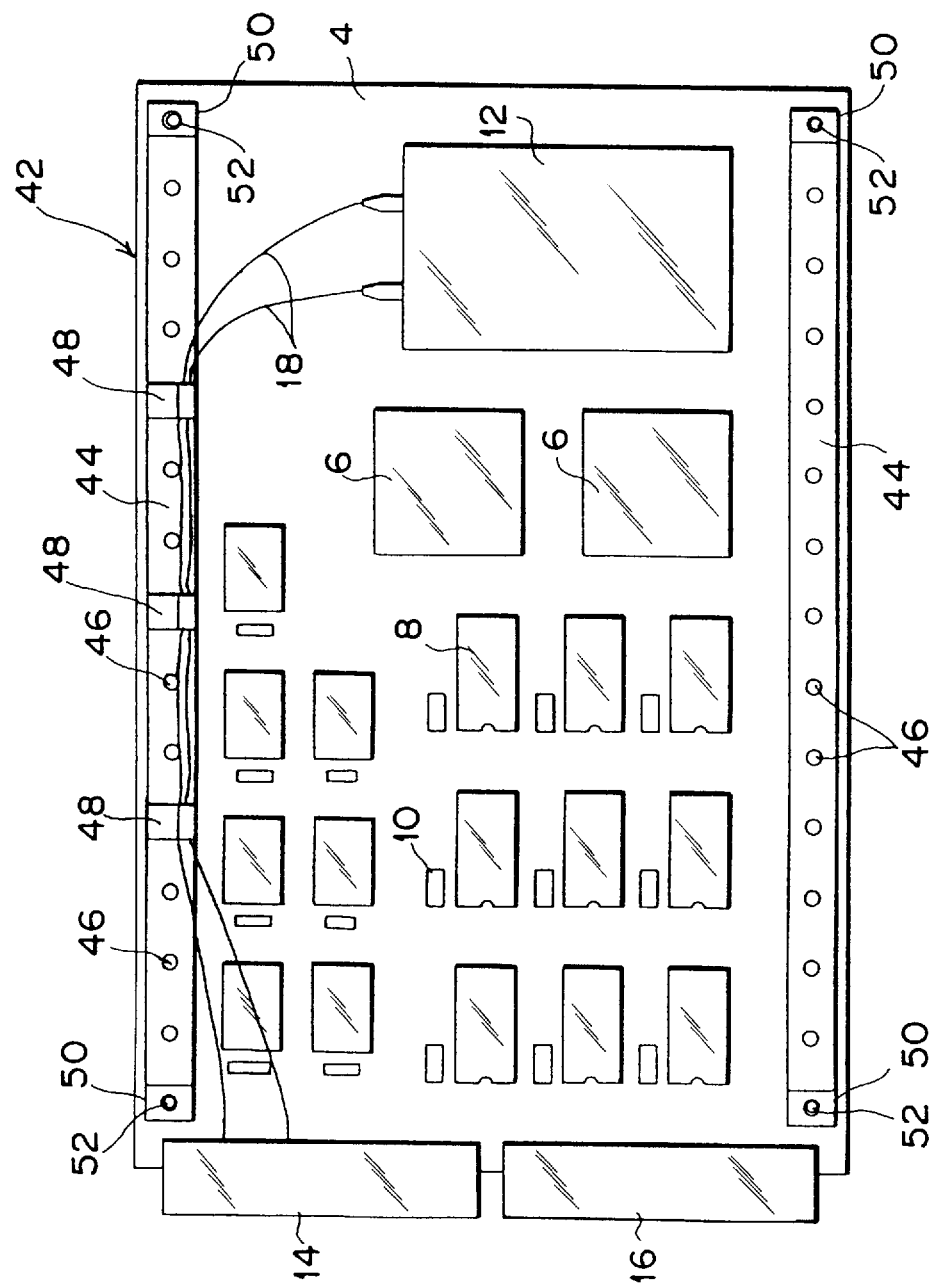
FIG. 5 is a plan view of a second preferred embodiment of the present invention.
Figure 6:
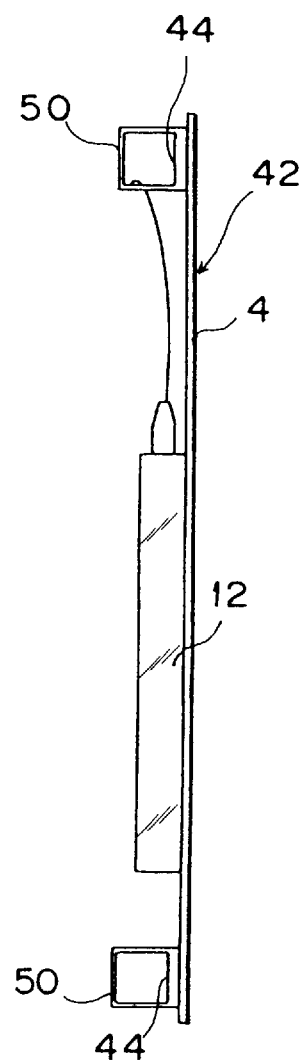
FIG. 6 is a side view of the second preferred embodiment.

Referring to FIG. 5, there is shown a plan view of an electronic circuit package 42 according to a second preferred embodiment of the present invention. Substantially the same parts as those of the first preferred embodiment will be denoted by the same reference numerals, and the description thereof will be omitted to avoid repetition. A pair of warp prevention fittings 44 are fixed to a printed circuit board 4 in the vicinity of the upper and lower edges thereof. Each warp prevention fitting 44 has a plurality of mounting holes 46 arranged at equal intervals along the upper or lower edge of the printed circuit board 4. A plurality of cable holders 48 are mounted on the upper warp prevention fitting 44 through the mounting holes 46 in this preferred embodiment. However, the cable holders 48 may be mounted on the lower warp prevention fitting 44 or on both the upper and lower warp prevention fittings 44.

As shown in FIG. 7, each cable holder 48 is mounted on the upper warp prevention fitting 44 by inserting a leg 54 of the cable holder 48 into a suitable one of the mounting holes 46 of the upper warp prevention fitting 44. A projection 56 of the cable holder 48 is engaged with the edge of the upper warp prevention fitting 44, thereby preventing rotation of the cable holder 48. As similar to the first preferred embodiment, each warp prevention fitting 44 is formed at its both ends with a pair of supports 50 each having a tapped hole 52. Each support 50 has a height greater than the height of each cable holder 48. In the second preferred embodiment, each cable holder 48 is detachable from each warp prevention fitting 44. Accordingly, a required number of cable holders 48 may be mounted on either or both the warp prevention fittings 44 at required positions thereon for the slack handling of the optical cables 18.

Referring to FIG. 8, there is shown a plan view showing a condition where a plurality of electronic circuit packages 2 are stacked. Also in such a stacked condition of the electronic circuit packages 2, it is possible to prevent that leads of mounted components of the upper electronic circuit package 2 may come into contact with mounted components of the lower electronic circuit package 2, because the height of each cable holder 22 integral with each warp prevention fitting 20 is greater than the height of each component mounted on the printed circuit board of each electronic circuit package 2.

Referring to FIG. 9, there is shown an exploded perspective view of a preferred embodiment wherein two different electronic circuit packages 2 and 60 are integrated together. As described above, the electronic circuit package 2 includes the pair of warp prevention fittings 20 extending along the upper and lower edges of the printed circuit board 4, and each warp prevention fitting 20 has the two supports 24 at both ends, each support 24 having the tapped hole 26. On the other hand, the other electronic circuit package 60 is fixed to the totally four supports 24 of the two warp prevention fittings 20 of the electronic circuit package 2 by engaging four screws 62 into the tapped holes 26 of the four supports 24, thus integrating the two electronic circuit packages 2 and 60.

Also in this case, it is possible to prevent that leads of mounted components of the upper electronic circuit package 60 may come into contact with the mounted components of the lower electronic circuit package 2, because the height of each support 24 is greater than the height of each component mounted on the printed circuit board 4 of the lower electronic circuit package 2. The size of the upper electronic circuit package 60 is smaller than the size of the lower electronic circuit package 2. Accordingly, in vertically mounting the assembly of the electronic circuit packages 2 and 60 into the shelf 30 shown in FIG. 4, the printed circuit board 4 of the electronic circuit package 2 is inserted along the upper and lower, two guide rails 32 into the shelf 30.

While the slack handling of the optical cables has been described in the above preferred embodiments, the present invention is similarly applicable to the slack handling of coaxial cables.

According to the present invention, each warp prevention fitting can serve also as means for performing the slack handling of cables, thereby allowing effective utilization of a component mounting region. Further, the slack handling of cables can be easily modified in position, and a cable route can be ensured at the upper or lower edge portion of the printed circuit board, thereby protecting the cables from breakage or the like.

What is claimed is:

1. A warp prevention structure for a printed circuit board comprising:

a first warp prevention fitting mounted on said printed circuit board in the vicinity of an upper edge thereof so as to extend along said upper edge; and a second warp prevention fitting mounted on said printed circuit board in the vicinity of a lower edge thereof so as to extend along said lower edge;

each of said first and second warp prevention fittings being integrally formed with a plurality of cable holders arranged at equal intervals; and wherein each of said cable holders has a height greater than a height of each of components mounted on said printed circuit board.

2. A warp prevention structure for a printed circuit board according to claim 1, wherein each of said first and second warp prevention fittings is formed at its both ends with a pair of supports each having a tapped hole, each of said supports having a height greater than the height of each cable holder.

3. A warp prevention structure for a printed circuit board, comprising:

a first warp prevention fitting mounted on said printed circuit board in the vicinity of an upper edge thereof so as to extend along said upper edge, said first warp prevention fitting having a plurality of mounting holes arranged at equal intervals;

a second warp prevention fitting mounted on said printed circuit board in the vicinity of a lower edge thereof so as to extend along said lower edge, said second warp prevention fitting having a plurality of mounting holes arranged at equal intervals; and a plurality of cable holders detachably mounted through said mounting holes on at least one of said first and second warp prevention fittings.

4. A warp prevention structure for a printed circuit board according to claim 3, wherein said cable holders are detachably mounted through said mounting holes on both said first and second warp prevention fittings, and each of said cable holders has a height greater than a height of each of components mounted on said printed circuit board.

5. A warp prevention structure for a printed circuit board according to claim 3, wherein each of said first and second warp prevention fittings is formed at its both ends with a pair of supports each having a tapped hole, each of said supports having a height greater than the height of each cable holder.

* * * * *